(12) United States Patent
Fu et al.

(10) Patent No.: US 11,201,055 B2
(45) Date of Patent: Dec. 14, 2021

(54) SEMICONDUCTOR DEVICE HAVING HIGH-κ DIELECTRIC LAYER AND METHOD FOR MANUFACTURING THE SAME

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Chien-Hua Fu, Kaohsiung (TW); Keng-Yung Lin, Tainan (TW); Yen-Hsun Lin, Changhua (TW); Kuanhsiung Chen, Pitou Township, Changhua County (TW); Juei-Nai Kwo, Zhubei (TW); Minghwei Hong, Zhubei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/706,095

(22) Filed: Sep. 15, 2017

(65) Prior Publication Data
US 2018/0151356 A1    May 31, 2018

Related U.S. Application Data

(60) Provisional application No. 62/427,657, filed on Nov. 29, 2016.

(51) Int. Cl.
*H01L 21/02* (2006.01)
*H01L 29/78* (2006.01)
(Continued)

(52) U.S. Cl.
CPC .... *H01L 21/02387* (2013.01); *H01L 21/0228* (2013.01); *H01L 21/02192* (2013.01);
(Continued)

(58) Field of Classification Search
CPC .......... H01L 21/2826; H01L 21/02192; H01L 21/0228; H01L 21/02318; H01L 21/02266;
(Continued)

(56) References Cited

U.S. PATENT DOCUMENTS 8,012,824 B2* 9/2011 Yao .................... C23C 16/56
438/240
2002/0031920 A1* 3/2002 Lyding ............. H01L 21/28176
438/795

(Continued)

OTHER PUBLICATIONS

Y. H. Lin et al., "Low interfacial trap density and high-temperature thermal stability in atomic layer deposited single crystal Y2O3/n-GaAs(001)", Applied Physics Express 9, 081501 (2016).
(Continued)

*Primary Examiner* — Kyoung Lee
*Assistant Examiner* — Christina A Sylvia
(74) *Attorney, Agent, or Firm* — McDermott Will & Emery LLP

(57) ABSTRACT

A method for manufacturing a semiconductor device includes forming a semiconductor layer on a substrate, forming a high-κ dielectric layer directly on the semiconductor layer as formed, and annealing the semiconductor layer, the high-dielectric layer, and the substrate. The semiconductor layer is a Group III-V compound semiconductor.

20 Claims, 9 Drawing Sheets

(51) Int. Cl.
*H01L 29/66* (2006.01)
*H01L 29/20* (2006.01)
*H01L 21/28* (2006.01)
*H01L 27/06* (2006.01)
*H01L 21/324* (2006.01)
*H01L 29/51* (2006.01)

(52) U.S. Cl.
CPC .. *H01L 21/02266* (2013.01); *H01L 21/02318* (2013.01); *H01L 21/28194* (2013.01); *H01L 21/28202* (2013.01); *H01L 21/28264* (2013.01); *H01L 27/0629* (2013.01); *H01L 29/20* (2013.01); *H01L 29/66522* (2013.01); *H01L 29/78* (2013.01); *H01L 21/324* (2013.01); *H01L 29/517* (2013.01); *H01L 29/518* (2013.01)

(58) Field of Classification Search
CPC ......... H01L 21/28194; H01L 21/28202; H01L 21/324; H01L 21/02387; H01L 27/0629; H01L 29/78; H01L 29/66522; H01L 29/20; H01L 29/518; H01L 29/517
See application file for complete search history.

(56) References Cited

U.S. PATENT DOCUMENTS

2003/0057432 A1* 3/2003 Gardner ............ H01L 21/28185 257/100
2006/0024928 A1* 2/2006 Seebauer .............. H01L 21/306 438/514
2007/0004224 A1* 1/2007 Currie ................ H01L 21/3141 438/778

OTHER PUBLICATIONS

Y. H. Lin et al., "Single-Crystal Y2O3 Epitaxially on GaAs(001) and (111) Using Atomic Layer Deposition", Materials 2015, 8, 7084-7093.

S. Y. Wu, et. al., "Single-crystal atomic layer deposited Y2O3 on GaAs(001)—growth, structural, and electrical characterization", Microelectronic Engineering 147 (2015), 310-313.

Y. Q. Cao et al., "Improved thermal stability and electrical properties of atomic layer deposited HfO2/AlN high-k gate dielectric stacks on GaAs", Journal of Vacuum Science & Technology A, vol. 33, No. 1, Jan./Feb. 2015.

T. Aoki et al., "Nitride passivation reduces interfacial traps in atomic-layer-deposited Al2O3/GaAs (001) metal-oxide-semiconductor capacitors using atmospheric metal-organic chemical vapor deposition", Applied Physics Letters 105, 033513, (2014).

Fei Gao et al., "GaAs metal-oxide-semiconductor device with Hf O 2/Ta N gate stack and thermal nitridation surface passivation", Applied Physics Letters 90, 252904 (2007).

T. Yang et al., "Interface studies of GaAs metal-oxide-semiconductor structures using atomic-layer-deposited HfO2O3 nanolaminate gate dielectric", Applied Physics Letter, (2007), vol. 91, pp. 142122-1-142122-3.

* cited by examiner

SEMICONDUCTOR DEVICE HAVING HIGH-κ DIELECTRIC LAYER AND METHOD FOR MANUFACTURING THE SAME

PRIORITY CLAIM AND CROSS-REFERENCE

This application claims priority to U.S. Provisional Application No. 62/427,657 filed Nov. 29, 2016, entitled "Semiconductor Device Having High-κ Dielectric Layer And Method For Manufacturing The Same," the entire disclosure of which is incorporated herein by reference.

TECHNICAL FIELD

The present disclosure is related to a semiconductor device having a high-κ dielectric layer and a method for manufacturing the same.

BACKGROUND

In a metal-oxide-semiconductor structure, an interface between an oxide layer formed of, for example, a high-κ dielectric material, and a semiconductor layer formed of, for example, Group III-V materials, has a low thermal stability and is unable to sustain at a temperature of 700° C. or higher. When a processing temperature is lower than 700° C., it seriously hinders effective activation of ion implantation in source/drain regions of the transistors and/or source/drain regrowth to lower the ohmic contact resistance. Some researchers have inserted an interfacial passivation layer (IPL) prior to growing a high-κ dielectric layer onto a semiconductor layer to overcome the thermal stability issue; however, the lower dielectric constant IPL reduces the benefits of using the grown high-κ dielectric layer by reducing the overall dielectric constant.

On the other hand, Fermi levels at an interface of a high-κ dielectric layer and a semiconductor layer such as an (In)GaAs layer may be pinned due to high interfacial trap densities, which may cause failure of high performance inversion-channel transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
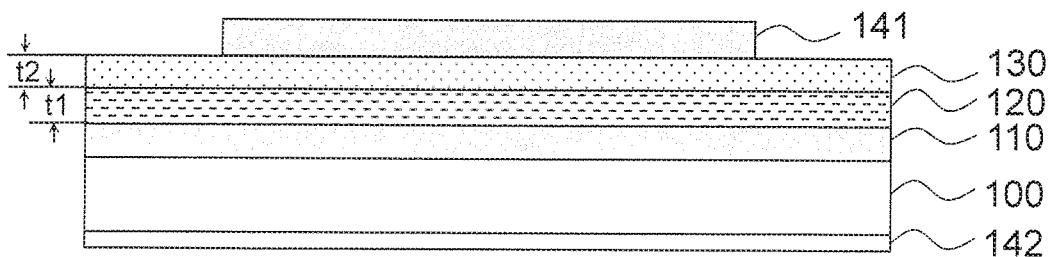
FIG. 1 schematically illustrates a cross-sectional view of a metal-oxide-semiconductor (MOS) capacitor including a multilayer structure having a high-κ dielectric layer and a semiconductor layer according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In the entire disclosure, "about" or "approximately" used to describe a parameter means that design error/margin, manufacturing error/margin, measurement error etc. are considered to define the parameter. Such a description should be recognizable to one of ordinary skill in the art.

FIG. 1 schematically illustrates a cross-sectional view of a metal-oxide-semiconductor (MOS) capacitor including a multilayer structure having a high-κ dielectric layer and a semiconductor layer according to embodiments of the present disclosure.

Referring to FIG. 1, a MOS capacitor includes a substrate 100 and a multilayer structure including a semiconductor layer 110 and one or more high-κ dielectric layers 120, formed over the substrate 100. Alternatively and/or optionally, the multilayer structure further includes a protection layer 130 disposed on the one or more high-κ dielectric layers 120 to protect the one or more high-κ dielectric layers from being directly exposed to exterior. The MOS capacitor further includes first and second electrodes 141 and 142 disposed on the protection layer 130 and a bottom surface of the substrate 100, respectively. If the protection layer 130 is not used, the first electrode 141 is disposed on the high-κ dielectric layer 120.

According to other embodiments, in a case in which the multilayer structure including the semiconductor layer 110, the high-κ dielectric layer 120, and the optional protection layer 130 is implemented into other types of semiconductor devices such as a metal-oxide-semiconductor field-effect transistor (MOSFET), the first electrode 141 formed on the optional protection layer 130 can be configured to be a gate electrode, and the second electrode 142 may be omitted. These features will be more apparent with reference to FIGS. 6A-9B to be described later.

The substrate 100 can be a Group III-V compound semiconductor including AlN, AlP, AlAs, AlSb, AlBi, GaN, GaP, GaAs, GaSb, GaBi, InN, InP, InAs, InSb, InBi, $Al_xGa_{1-x}As$ (0<x<1), or $In_yGa_{1-y}As$ (0<y<1). In other embodiments, the substrate can be a Group II-VI or a Group IV semiconductor such as Si and Ge. A surface of the substrate 100 on which the multilayer structure is formed can be a flat surface obtained by, for example, chemical mechanical polishing (CMP), or can have patterned structures such as steps formed thereon or have any intentionally formed or unintentionally formed textures. In some embodiments, the multilayer structure may extend across an entire deposition surface of the substrate 100, although the present disclosure is not limited thereto.

The semiconductor layer 110 is a Group III-V compound semiconductor including AlN, AlP, AlAs, AlSb, AlBi, GaN, GaP, GaAs, GaSb, GaBi, InN, InP, InAs, InSb, InBi, or combination of the above semiconductors including, but not limited to, $Al_xGa_{1-x}As$ (0<x<1) and $In_yGa_{1-y}As$ (0<y<1). According to some embodiments, an orientation of the major surface of the semiconductor layer 110 is (001) orientation. In some other embodiments, the orientation of the major surface of the semiconductor layer 110 can be (111), (110) or $(0001)_H$. The semiconductor layer 110 can be formed by, for example, metal-organic chemical vapor deposition (MOCVD) or, molecular beam epitaxy (MBE), although the present disclosure is not limited thereto.

In this disclosure, a high-κ dielectric layer/material refers to a layer/material having a dielectric constant K greater than that 3.9, a dielectric constant of silicon dioxide ($SiO_2$), and a non-high-κ dielectric layer/material refers to a layer/material having a dielectric constant x no more than 3.9. In some embodiments, the one or more high-κ dielectric layers 120 can be a high-κ oxide, for example, $Y_2O_3$, $HfO_2$, $ZrO_2$, $TiO_2$, $Sc_2O_3$, $Al_2O_3$, $Ga_2O_3$, $LaO_3$, $Ce_2O_3$, $Pr_2O_3$, $Nd_2O_3$, $Sm_2O_3$, $Eu_2O_3$, $Gd_2O_3$, $Dy_2O_3$, $Ho_2O_3$, $Er_2O_3$, $Tm_2O_3$, or $Lu_2O_3$, or a combination of the above exemplary oxides, or any other suitable material. In other embodiments, the one or more high-κ dielectric layers 120 can be nitride-base material, for instance, AlN. In some embodiments, the high-κ dielectric layers 120 can have a dielectric constant tripled that of $SiO_2$. The one or more high-κ dielectric layers 120 can include one layer formed of one of the above high-κ dielectric materials and another layer formed of another of the above high-κ dielectric materials, although the present disclosure is not limited thereto. The one or more high-κ dielectric layers 120 can be formed by, for example, atomic layer deposition (ALD), directly on the semiconductor layer 110, although the present disclosure is not so limited.

According to some embodiments, an interfacial trap density $D_{it}$ of an interface between the semiconductor layer 110 and a dielectric layer immediately adjacent thereto, i.e., the one or more high-κ dielectric layers 120 directly formed on the semiconductor layer 110, is from about $2 \times 10^{11}$ $cm^{-2}eV^{-1}$ to about $3 \times 10^{11}$ $cm^{-2}eV^{-1}$. In some embodiments, the interfacial trap density $D_{it}$ can be lower than about $2 \times 10^{11}$ $cm^{-2}eV^{-1}$. In a case in which the interfacial trap density $D_{it}$ is from about $2 \times 10^{11}$ $cm^{-2}eV^{-1}$ to about $3 \times 10^{11}$ $cm^{-2}eV^{-1}$, it is possible to obtain a high performance inversion-channel formed at the interface between the semiconductor layer 110 and the one or more high-κ dielectric layers 120.

According to embodiments of the present disclosure, the one or more high-κ dielectric layers 120 are directly formed on the semiconductor layer 110, without any interfacial passivation layer, such as AlN (in a case in which the one or more high-κ dialectic layers is formed of oxide) or Si, inserted between the one or more high-κ dielectric layers 120 and the semiconductor layer 110, or without any pre-surface treatment on the semiconductor layer 110 before the deposition of the high-κ dielectric layer 120. The pre-surface treatment includes one or more of a chemical treatment, a nitridation treatment and a plasma treatment. In some embodiments, the one or more high-κ dielectric layers 120 are formed on the as-deposited or as-formed surface of the semiconductor layer 110. In a case in which a structure including an interface formed not by the method according to embodiments of the present disclosure, but formed by a method including forming an interfacial passivation layer prior to forming a dielectric layer or a method including a pre-surface treatment prior to forming a dielectric layer, the interfacial trap density $D_{it}$ will be greater than the range of about $2 \times 10^{11}$ $cm^{-2}eV^{-1}$ to about $3 \times 10^{11}$ $cm^{-2}eV^{-1}$ achievable by the method according to embodiments of the present disclosure.

As shown in FIG. 1, the first electrode 141, which is disposed on one side of the one or more dielectric layers 120 opposite to another side of the one or more dielectric layers 120 on which the semiconductor layer 110 is formed, can be formed of doped polysilicon, metal silicides, W, Co, Ni, Al, Ti, TiN, Au, Pt or an alloy thereof, or any other suitable gate electrode materials. The second electrode 142, which is on a bottom surface of the substrate 100, can be formed of Ti/Au, AuGe, AuBe, AuZn, Ni or an alloy thereof. Shapes of the first and second electrodes 141 and 142 are not limited to those shown in FIG. 1. In some embodiments, the first electrode 141 can entirely covers or overlaps the one or more dielectric layers 120, and/or the second electrode 142 can be partially covers or overlaps the bottom surface of the substrate 100.

Referring to FIG. 1, the protection layer 130 is optionally formed on the one or more high-κ dielectric layers 120 so that the one or more high-κ dielectric layers 120, which may be vulnerable to moisture, can be protected from being directly exposed to air containing moisture.

However, in some other embodiments, the protection layer 130 can be omitted, if the one or more high-κ dielectric layer is stable in air or in an environment exposed thereto or if the first electrode 141 entirely covers the one or more high-κ dielectric layers 120 to protect the one or more high-κ dielectric layers 120. In this case, the first electrode 141 can directly be formed on the one or more high-κ dielectric layers 120.

In some embodiments, a thickness t1 of the one or more high-κ dielectric layers 120 can be in a range of about 0.1 nm to about 10 nm. When the thickness t1 is greater than about 10 nm, the capacitance value required to the MOS capacitor decreases and the deposition time of the one or more high-κ dielectric layers 120 may be too long, inevitably increasing unnecessary manufacturing time and cost. The thickness t1 of the one or more high-κ dielectric layers 120, however, is not so limited, and can be adjusted according to design particulars.

A thickness of t2 of the protection layer 130 can be in a range of about 0.5 nm to about 8 nm. When the thickness t2 of the protection layer 130 is less than about 0.5 nm, the protection layer 120 may not be able to effectively protect the one or more high-κ dielectric layers 110 formed therebelow, because moisture can permeate through the protection layer 130 having a thickness of 2 nm or less, and when the thickness t2 of the protection layer 130 is greater than about 8 nm, the deposition time of the protection layer 130 may be too long, inevitably increasing unnecessary manufacturing time and cost, and capacitance of the MOS capacitor has to be inevitably decreased. In some embodiments, each of the thickness t1 of the one or more high-κ dielectric layers 120 and the thickness t2 of the protection layer 130 is less than 1 nm. In some embodiments, a sum of the thickness t1 of the one or more high-κ dielectric layers 120 and the thickness t2 of the protection layer 130 is less than 1 nm. The thickness t2 of the protection layer 130, however, is not so limited, and can be adjusted according to design particulars.

One of ordinary skill in the art would appreciate that in a case in which the protection layer 130 is another high-κ dielectric layer included in the multilayer structure, the thickness t1 of the one or more dielectric layers 120 can be reduced, as compared to an example in which the protection layer 130 is omitted.

Figure 2:
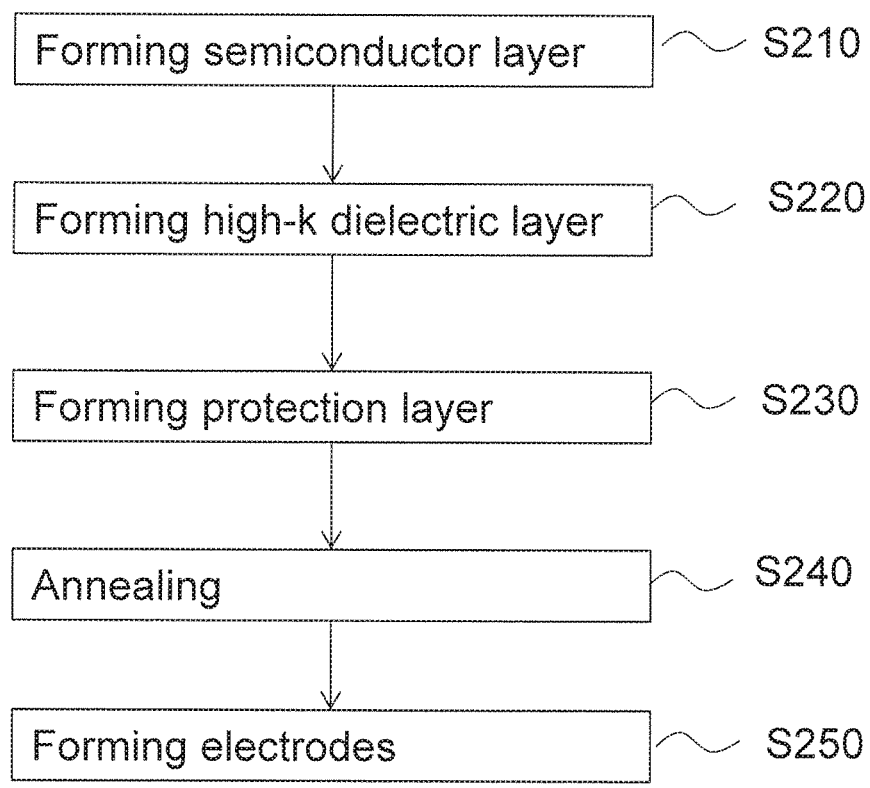
FIG. 2 illustrates a flowchart of a method for manufacturing the MOS capacitor shown in FIG. 1 according to embodiments of the present disclosure.

FIG. 2 illustrates a flowchart of a method for manufacturing the MOS capacitor shown in FIG. 1 according to embodiments of the present disclosure.

In the following descriptions with reference to FIGS. 1 and 2, a heavily doped N-type GaAs substrate is described as an exemplary substrate, a GaAs(001) layer doped with Si is described as an exemplary semiconductor layer, a $Y_2O_3$ layer formed by, for example, ALD, is described as an exemplary high-κ dielectric layer, an $Al_2O_3$ layer formed on the $Y_2O_3$ layer is described as an exemplary protection layer, and an Ni electrode and a Ti/Au electrode are described as exemplary first and second electrodes, respectively. One of ordinary skill in the art would understand that the present disclosure should not be limited thereto and that other materials described above can be alternatively and/or optionally used.

With reference to FIGS. 1 and 2, the semiconductor layer 110 which is a GaAs(001) with a 4×6 surface is formed, for example, by molecular beam epitaxy (MBE) or metal-organic chemical vapor deposition (MOCVD), on the substrate 100 which is a GaAs—$N^+$ substrate (S210). In some embodiments, a GaAs(001) layer with a 2×4 surface can be first formed and a GaAs(001) layer with a 4×6 is surface then formed thereon when the GaAs(001)-2×4 is heated up to 520-580° C. without arsenic vapor pressure on its surface.

Thereafter, the one or more high-κ dielectric layers 120, which can be an $Y_2O_3$ layer formed by ALD, are formed on the semiconductor layer 110 (S220). The $Y_2O_3$ layer can be grown with suitable precursors such as cyclopentadienyl-type compound and water and suitable reactant such as $Y(EtCp)_3$, $(iPrCp)_2Y(iPr-amd)$, $Y(iPrCp)_3$, $Y(Cp)_3$, and $Y(MeCp)_3$, although the present disclosure is not limited thereto. Cycles required to repeatedly form a plurality of monolayers of $Y_2O_3$ constituting the one or more high-κ dielectric layers 120 can be determined to be equal to a ratio of the desired thickness t1 of the one or more high-κ dielectric layers 120 and a thickness of an ALD $Y_2O_3$ monolayer. In other embodiments, the growth of the one or more high-κ dielectric layers 120 can be carried out by other vapor phase deposition methods including, but not limited to, molecular layer deposition (MLD), chemical vapor deposition (CVD), sputtering, molecular beam epitaxy (MBE), or chemical beam epitaxy (CBE).

According to embodiments of the present disclosure, between steps S210 and S220, none of surface treatments including, but not limited to, chemical cleaning, a thermal treatment, an anodic treatment, a plasma treatment, and/or a vacuum treatment, for example, at a pressure lower than 760 torr, of the semiconductor layer 110, is performed.

According to embodiments of the present disclosure, between steps S210 and S220, none of surface passivations including, but not limited to, dipping the substrate 100 together with the formed semiconductor layer 110 thereon into a $(NH_4)_2S$ solution, surface nitridation by thermal or plasma treatment, and forming an interfacial passivation layer such as AlN and Si, is performed.

That is, the one or more high-κ dielectric layers 120 are directly formed on the surface of the semiconductor layer 110 as deposited (or as formed). In some embodiments, the growth of the semiconductor layer 110 (S210) and the one or more high-κ dielectric layers 120 (S220) can be performed in a multi-chamber MBE/ALD system, without taking the substrate 100 out from the multi-chamber MBE/ALD system. In other words, the substrate with the semiconductor layer 110 formed thereon is transferred from one vacuum chamber (an MBE chamber) to another vacuum chamber (an ALD chamber) under a low pressure condition without being exposed to atmosphere.

Alternatively and/or optionally, the protection layer 130, which, for example, is an $Al_2O_3$ layer, can be formed by, for example, ALD, on the one or more high-1K dielectric layers 120 (S230). The $Al_2O_3$ layer can be grown with suitable precursors such as trimethylaluminium (TMA) and a suitable reactant such as water vapor, oxygen, and ozone, although the present disclosure is not limited thereto. Cycles required to repeatedly form a plurality of monolayers of $Al_2O_3$ constituting the protection layers 130 can be determined to be equal to a ratio of the desired thickness t2 of the protection layers 130 and a thickness of an ALD $Al_2O_3$ monolayer. In other embodiments, the growth of the protection layer can be carried out by other vapor phase deposition methods including, but not limited to, molecular layer deposition (MLD), chemical vapor deposition (CVD), sputtering, molecular beam epitaxy (MBE), or chemical beam epitaxy (CBE). In some embodiments, to avoid any moisture contamination of the one or more high-κ dielectric layers 120, the growth of the protection layer 130 can be performed in the same chamber used for forming the one or more high-κ dielectric layers 120, immediately after forming the one or more high-κ dielectric layers 120 without taking the substrate 100 out from the chamber.

Thereafter, in some embodiments, the substrate 100, together with the multilayer structure including the semiconductor layer 110, the one or more high-κ dielectric layers 120, and the optional protection layer 130 formed on the substrate 100, is annealed at an annealing temperature, for example, from room temperature to about 1500° C. (S240). The annealing temperature can be increased from room temperature at a rate, for example, about 50° C./second. In some embodiments, the annealing temperature can be from about 300° C. to about 1050° C. for about 0.1 second to about 10 hours. In certain embodiments, the annealing process can be performed from about 850° C. to about 1050° C. for about 0.1 seconds to about 90 seconds. The annealing can be performed by an annealing chamber or a furnace.

In some embodiments, the annealing can be performed at a temperature higher than the deposition temperature of the one or more high-κ dielectric layers 120 and/or the protection layer 130 in the multi-chamber system in which the one or more high-κ dielectric layers 120 and/or the protection layer 130 are deposited. In this case, the substrate 100, together with the one or more high-κ dielectric layers 120 and/or the protection layer 130 formed thereon, can be annealed after forming the one or more high-κ dielectric layers 120 and/or the protection layer 130 without taking the substrate 100 out from the multi-chamber system.

In some embodiments, the annealing can be performed by laser annealing.

The annealing process can be carried out in air, or gases with low reactivity such as $N_2$, He, Ar, and a combination thereof, or a highly reactive gas such as $H_2$, $O_2$ and ozone, and a combination thereof. In one embodiment, the annealing processing can be performed in a nitrogen-containing gas including a neutral form of nitrogen gas, instance nitrogen plasma, $NH_3$, or other organic nitrogen-containing gas, or a combination thereof.

Thereafter, the first and second electrodes 141 and 142 are formed on the protection layer 130 and the bottom surface of the substrate 100, respectively (S250). The first electrode 141 can be a Ni electrode formed, for example, by E-beam evaporation and the second electrode can be a multilayered electrode such as Ti/Au formed by, for example, thermal evaporation.

Optionally, after forming the first and second electrodes 141 and 142, post metallization annealing (PMA) can be performed, for example, at a temperature from about 300° C. to about 500° C. under a forming gas or other hydrogen-containing gas.

C-V characteristics of MOS capacitors manufactured according to the aforementioned method as described above are shown in FIGS. 3A-4B. The manufacturing conditions of various layers of the MOS capacitors are the same except that the annealing conditions are different from each other.

Figure 3A:
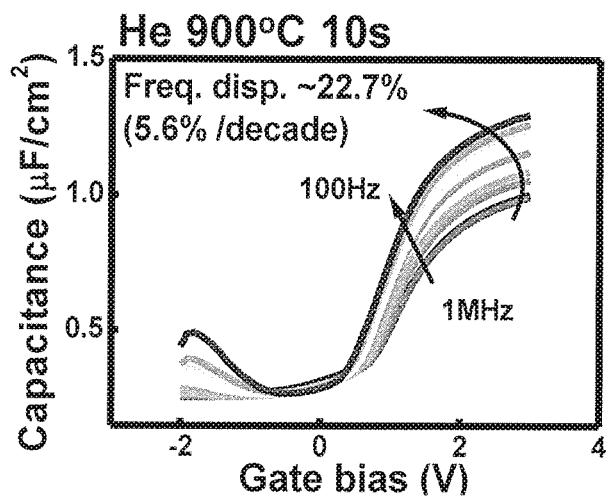
FIG. 3A shows C-V characteristics of a MOS capacitor including a $Y_2O_3$ layer formed by atomic layer deposition (ALD) as a high-κ dielectric layer and an n-GaAs(001)-4×6 as a semiconductor layer, annealed in He at 900° C. for 10 seconds after ALD and before forming electrodes.
Figure 3B:
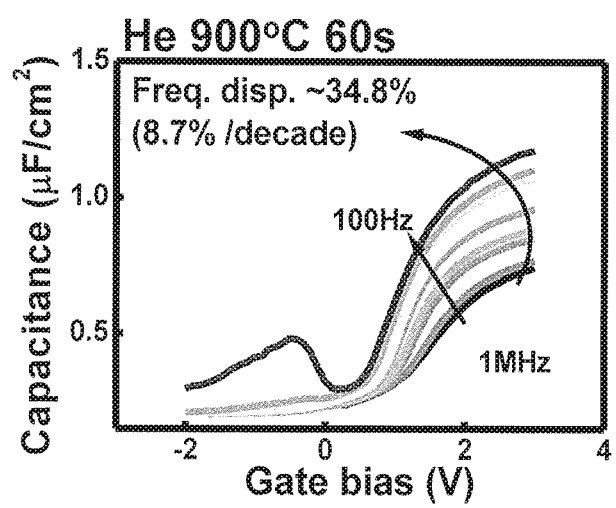
FIG. 3B shows C-V characteristics of a MOS capacitor including a $Y_2O_3$ layer formed by ALD as a high-κ dielectric layer and an n-GaAs(001)-4×6 as a semiconductor layer, annealed in He at 900° C. for 60 seconds after ALD and before forming electrodes.
Figure 3C:
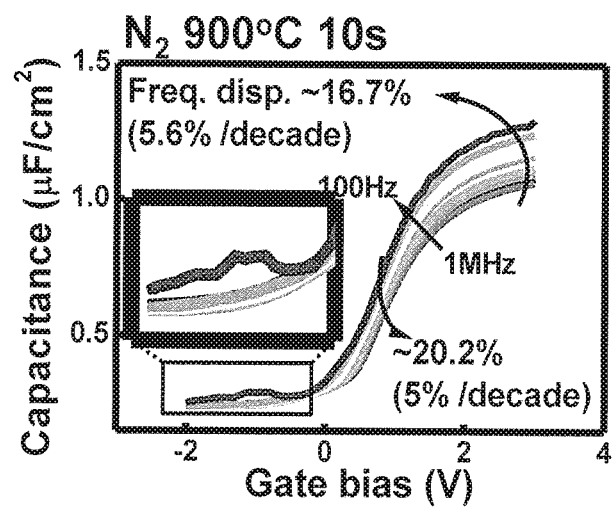
FIG. 3C shows C-V characteristics of a MOS capacitor including a $Y_2O_3$ layer formed by ALD as a high-κ dielectric layer and an n-GaAs(001)-4×6 as a semiconductor layer, annealed in $N_2$ at 900° C. for 10 seconds after ALD and before forming electrodes.
Figure 3D:
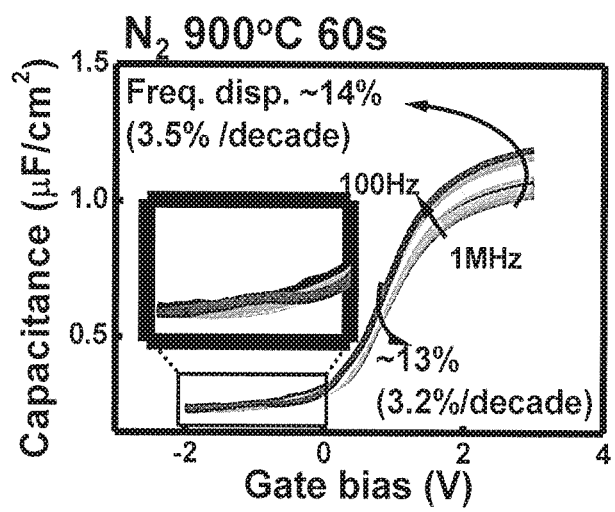
FIG. 3D shows C-V characteristics of a MOS capacitor including a $Y_2O_3$ layer formed by ALD as a high-κ dielectric layer and an n-GaAs(001)-4×6 as a semiconductor layer, annealed in $N_2$ at 900° C. for 60 seconds after ALD and before forming electrodes.

FIG. 3A shows C-V characteristics of a MOS capacitor including a $Y_2O_3$ layer formed by ALD as a high-κ dielectric layer and an n-GaAs(001)-4×6 as a semiconductor layer, annealed in He at 900° C. for 10 seconds after ALD before forming electrodes, FIG. 3B shows C-V characteristics of a MOS capacitor including a $Y_2O_3$ layer formed by ALD as a high-κ dielectric layer and an n-GaAs(001)-4×6 as a semiconductor layer, annealed in He at 900° C. for 60 seconds after ALD and before forming electrodes, FIG. 3C shows C-V characteristics of a MOS capacitor including a $Y_2O_3$ layer formed by ALD as a high-κ dielectric layer and an n-GaAs(001)-4×6 as a semiconductor layer, annealed in $N_2$ at 900° C. for 10 seconds after ALD and before forming electrodes, and FIG. 3D shows C-V characteristics of a MOS capacitor including a $Y_2O_3$ layer formed by ALD as a high-κ dielectric layer and an n-GaAs(001)-4×6 as a semiconductor layer, annealed in $N_2$ at 900° C. for 60 seconds after ALD and before forming electrodes.

C-V curves measured from 100 Hz to 1 MHz shown FIGS. 3A-3D indicate that frequency dispersions at accumulation regions are 22.7% (5.6%/decade), 34.8% (8.7%/decade), 16.7% (5.6%/decade), and 14% (3.5%/decade), respectively.

Figure 4A:
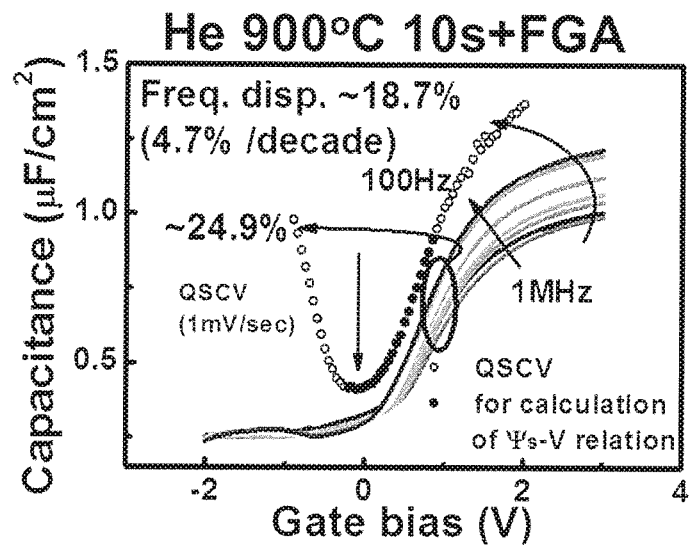
FIG. 4A shows C-V characteristics of a MOS capacitor including a $Y_2O_3$ layer formed by ALD as a high-κ dielectric layer and an n-GaAs(001)-4×6 as a semiconductor layer, annealed in He at 900° C. for 10 seconds after ALD and before forming electrodes and also annealed in a forming gas at 400° C. for 10 seconds after forming the electrodes.
Figure 4B:
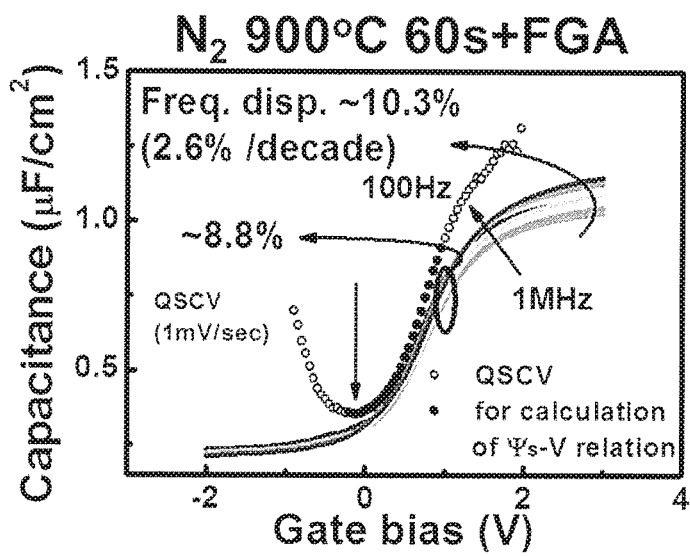
FIG. 4B shows C-V characteristics of a MOS capacitor including a $Y_2O_3$ layer formed by ALD as a high-κ dielectric layer and an n-GaAs(001)-4×6 as a semiconductor layer, annealed in $N_2$ at 900° C. for 60 seconds after ALD and before forming electrodes and also annealed in a forming gas at 400° C. for 10 seconds after forming the electrodes.

FIG. 4A shows C-V characteristics of a MOS capacitor including a $Y_2O_3$ layer formed by ALD as a high-κ dielectric layer and an n-GaAs(001)-4×6 as a semiconductor layer, annealed in He at 900° C. for 10 seconds after ALD and before forming electrodes and also annealed in a forming gas at 400° C. for 10 seconds after forming the electrodes, and FIG. 4B shows C-V characteristics of a MOS capacitor including a $Y_2O_3$ layer formed by ALD as a high-κ dielectric layer and an n-GaAs(001)-4×6 as a semiconductor layer, annealed in $N_2$ at 900° C. for 60 seconds after ALD and before forming electrodes and also annealed in a forming gas at 400° C. for 10 seconds after forming the electrodes.

C-V curves measured from 100 Hz to 1 MHz shown in FIGS. 4A and 4B indicate that frequency dispersions at accumulation regions are 18.7% (4.7%/decade) and 10.3% (2.6%/decade), respectively.

Figure 5:
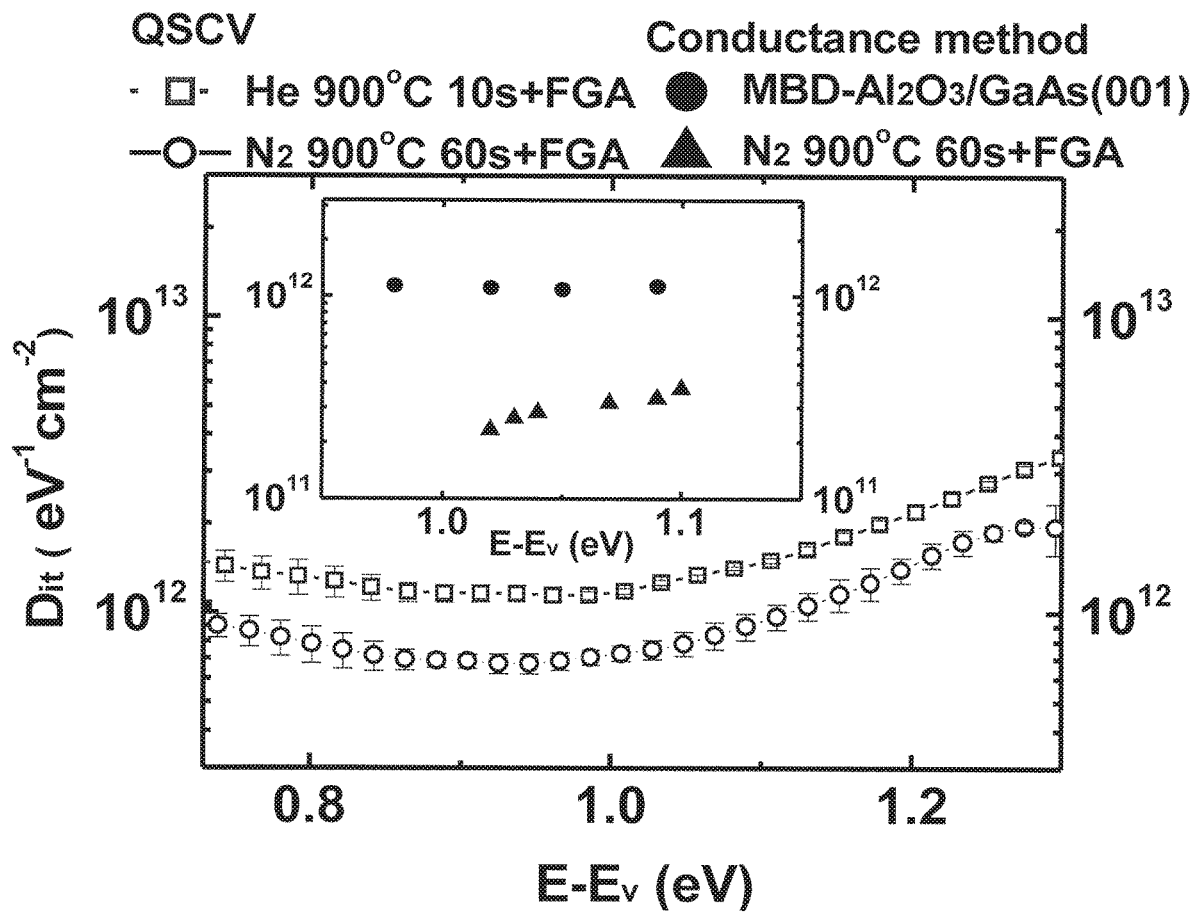
FIG. 5 shows interfacial trap densities $D_{it}$, measured by a conductance method and a quasi-static capacitance voltage (QSCV) method, of MOS capacitors manufactured by the method according to embodiments of the present disclosure.

FIG. 5 shows interfacial trap densities $D_{it}$, measured by a conductance method and a quasi-static capacitance voltage (QSCV) method, of MOS capacitors manufactured by the method according to embodiments of the present disclosure.

Referring to FIG. 5, the interfacial trap densities $D_{it}$ from mid-gap to the conduction band minimum are in a range of $(12$ to $30) \times 10^{11}$ $eV^{-1}cm^{-2}$ for the He annealed MOS capacitors, and in a range of $(6.3$ to $20) \times 10^{11}$ $eV^{-1}cm^{-2}$ for the $N_2$ annealed MOS capacitors. No peak is found in the interfacial trap densities $D_{it}$ around the mid-gap. A range of an interfacial trap density $D_{it}$ for the $N_2$ annealed MOS capacitor, measured by a room temperature conductance method, is $(2$ to $4) \times 10^{11}$ $eV^{-1}cm^{-2}$ in an energy range $(E-E_V)$ of 1.0 to 1.1 eV, where $E_V$ is the valence band maximum. An interfacial trap density $D_{it}$ of a MOS capacitor including an $Al_2O_3$ layer formed by molecular beam deposition (MBD) as a high-κ dielectric layer and an n-GaAs(001) as a semiconductor layer is about $1 \times 10^{12}$ $eV^{-1}cm^{-2}$ measured at 1 eV above the valence band edge, relatively higher than those of the MOS capacitor including $Y_2O_3$ formed by ALD as the high-κ dielectric layer.

According to embodiments of the present disclosure, the above multilayer structure of the MOS capacitor and the method for manufacture the multilayer structure can be employed to form other types of semiconductor devices, for example, a MOSFET.

Figure 6A:
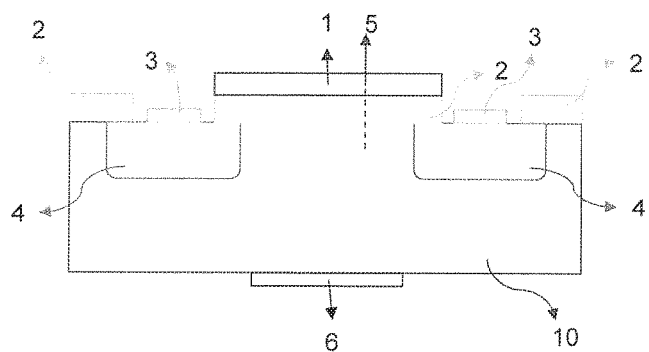
FIGS. 6A-6C illustrate a first cross-sectional view taken along a direction along source and drain regions, a second cross-sectional view taken along a direction perpendicular to the direction along the source and drain regions, and a top view of a planar MOSFET, respectively.
Figure 6B:
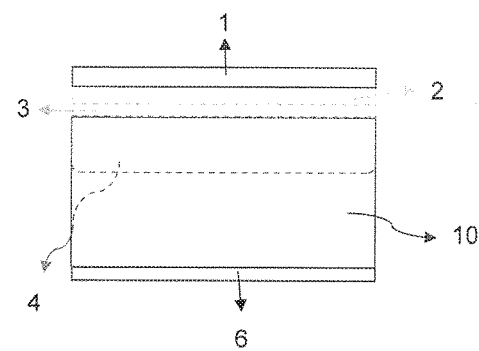
Figure 6C:
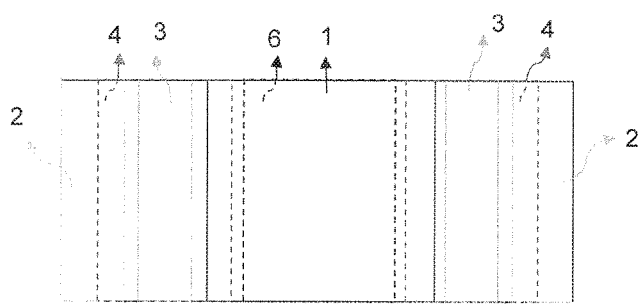

FIGS. 6A-6C illustrate a first cross-sectional view taken along a direction along source and drain regions, a second cross-sectional view taken along a direction perpendicular to the direction along the source and drain regions, and a top view of a planar MOSFET, respectively. A channel region and a gate insulating layer of the MOSFET shown in FIGS. 6A-6C are implemented by the aforementioned multilayer structure including a semiconductor layer, one or more high-κ dielectric layers, and an optional protection layer.

Referring to FIGS. 6A-6C, the MOSFET is formed on a semiconductor substrate 10 and includes source and drain regions 4, a channel region 5 therebetween, and a gate insulating layer 2 covering the channel region 5. Source and drain contacts 3 of the MOSFET are respectively formed on the source and drain regions 4 so as to electrically connect to the source and drain regions 4. The MOSFET further includes a gate electrode layer 1 covering the gate insulating layer 2.

The channel region 5 can be the semiconductor layer 110 of the aforementioned MOS capacitor formed by the aforementioned process, and the gate insulating layer 2 can be the one or more high-κ c dielectric layers 120 of the aforementioned MOS capacitor formed by the aforementioned process. Unlikely a contemporary MOSFET in which an interfacial passivation layer, such a non-high-κ dielectric, is inserted between a channel region and a high-κ dielectric layer, in this embodiment, the gate insulating layer 2, which is constituted by one or more high-κ dielectric layers, is formed directly on the channel region 5.

An interfacial trap density $D_{it}$ of an interface between the channel region 5 and the gate insulating layer 2 is from about $2\times10^{11}$ cm$^{-2}$eV$^{-1}$ to about $3\times10^{11}$ cm$^{-2}$eV$^{-1}$. In some embodiments, the interfacial trap density $D_{it}$ can be lower than about $2\times10^{11}$ cm$^{-2}$eV$^{-1}$. In a case in which the interfacial trap density $D_{it}$ is from about $2\times10^{11}$ cm$^{-2}$eV$^{-1}$ to about $3\times10^{11}$ cm$^{-2}$eV$^{-1}$, it is possible to obtain a high performance inversion-channel at the interface between the channel region 5 and the gate insulating layer 2. On the other hand, in a case in which a channel-gate insulating layer structure including an interface of a channel and a gate insulating layer formed not by the method according to embodiments of the present disclosure, but formed by a method including forming an interfacial passivation layer prior to forming a gate insulating layer or a method including a pre-surface treatment prior to forming a gate insulating layer, the interfacial trap density $D_{it}$ will be greater than the range of about $2\times10^{11}$ cm$^{-2}$eV$^{-1}$ to about $3\times10^{11}$ cm$^{-2}$eV$^{-1}$ achievable by the method according to embodiments of the present disclosure.

The gate electrode 1 can be formed by the aforementioned process for forming the aforementioned first electrode in the MOS capacitor. In other embodiments, the gate electrode 1 is made of one or more of doped polysilicon, W, Co, Ni, Al, Ti, TiN or an alloy thereof, or any other suitable gate electrode materials.

Although not shown in FIGS. 6A-6C, in some embodiment, a protection layer, which can be another high-κ dielectric material different from the high-κ dielectric material being in direct contact with the channel region 5, can be optionally interposed between the gate electrode 1 and the gate insulating layer 2.

Figure 7:
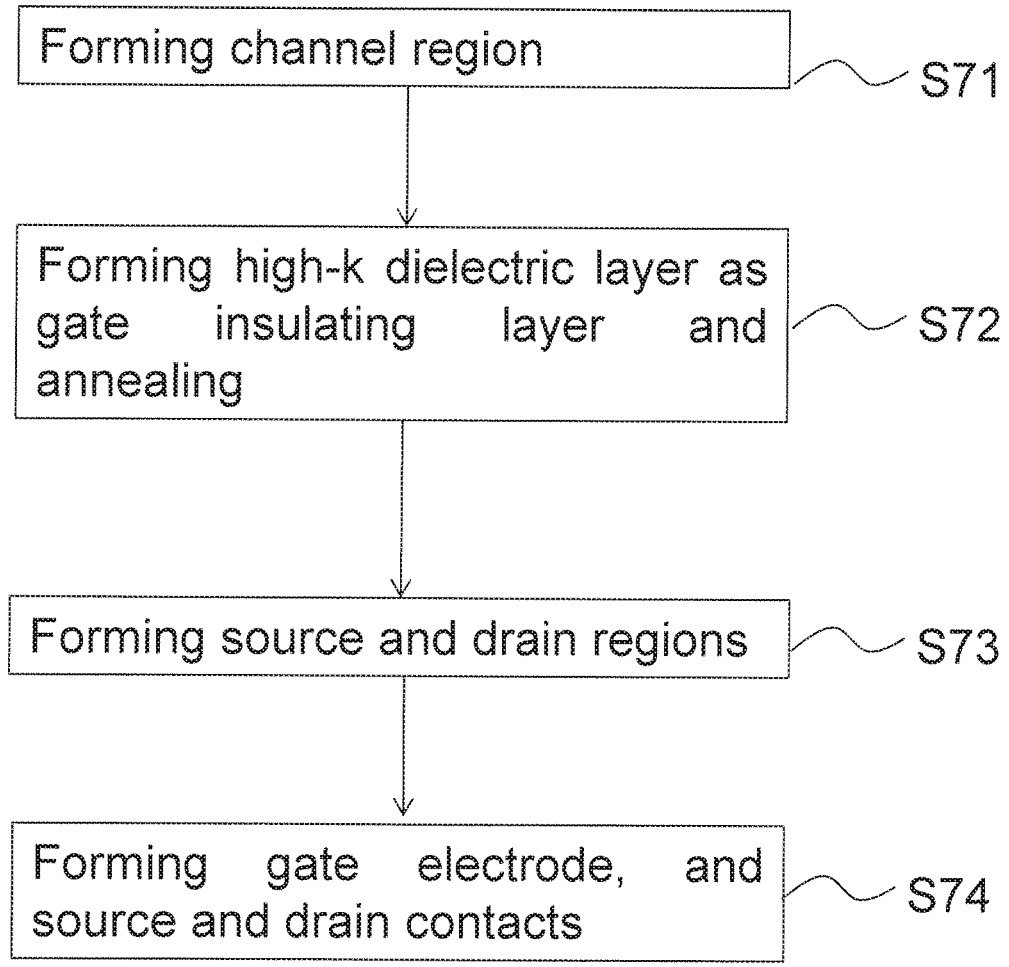
FIG. 7 shows a process flowchart to manufacture the planar MOSFET shown in FIGS. 6A-6C.

FIG. 7 shows a process flowchart to manufacture the planar MOSFET shown in FIGS. 6A-6C.

With reference to FIGS. 6A-7, the channel region 5 is formed on the substrate 100 (S71) by using MBE, MOCVD, or ALD.

Thereafter, without any surface treatment including, but not limited to, chemical cleaning, thermal treatment, anodic treatment, plasma treatment, and/or vacuum treatment of the channel region 5, the gate insulating layer 2 constituted by one or more high-κ dielectric layers is formed directly on the channel region 5, followed by an annealing process (S72). In this embodiment, no surface passivation including, but not limited to, dipping the substrate 10 together with the formed channel region 5 thereon into a (NH$_4$)$_2$S solution, surface nitridation by thermal or plasma treatment, and forming an interfacial passivation layer such as AlN and Si, is performed after forming the channel region 5 and before forming the gate insulating layer 2 directly on the channel region 5. Optionally, a protection layer can be formed on the one or more high-κ dielectric layers before the annealing process.

One of ordinary skill in the art should appreciate that forming the channel region 5, forming the gate insulating layer 2, and forming the optional protection layer, and annealing can be referred to steps S210, S220, S230, and S240 in FIG. 2, respectively. The materials selected for the substrate 10, the channel region 5, the gate insulating layer 2 which is a high-κ dielectric material and includes the optional protection layer in the MOSFET can be referred to the description of the substrate 100, the semiconductor layer 110, the one or more high-κ dielectric layers 120, and the optional protection layer 130 with reference to FIGS. 1 and 2. To avoid redundancy, an overlapped description will be omitted here.

Thereafter, source and drains are formed, for example, by ion implantation (S73).

Next, the gate electrode 1 covering the gate insulating layer 2 and the source and drain contacts 3 contacting the source and drain regions are formed (S74).

According to other embodiments, the above multilayer structure of the MOS capacitor and the method for manufacture the multilayer structure can be employed to form other types of MOSFETs, for example, fin MOSFET and gate-all-around MOSFET.

Figure 8A:
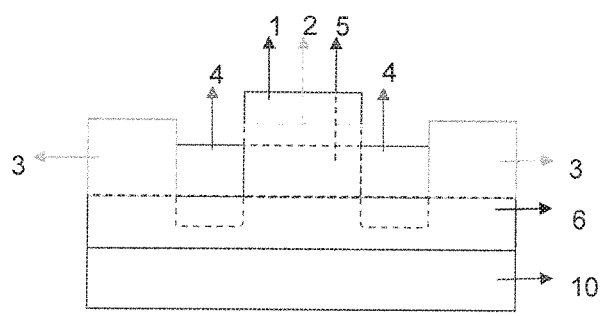
FIGS. 8A-8C illustrate a first cross-sectional view taken along a direction along source and drain regions, a second cross-sectional view taken along a direction perpendicular to the direction along the source and drain regions, and a top view of a fin MOSFET, respectively.
Figure 8B:
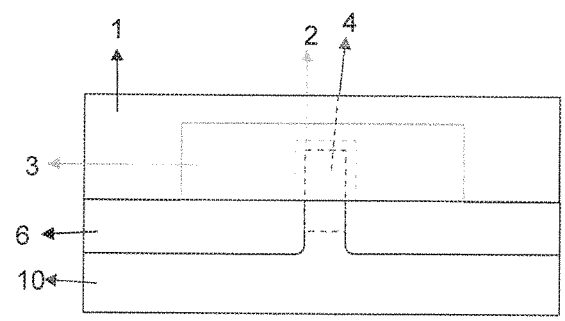
Figure 8C:
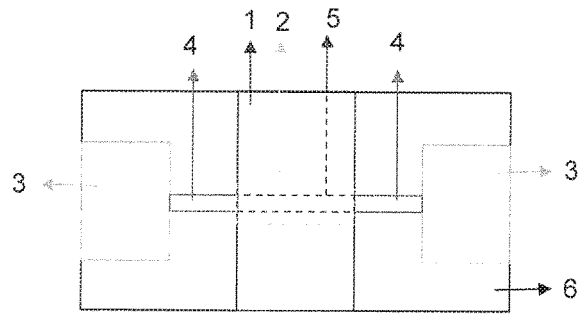
Figure 9A:
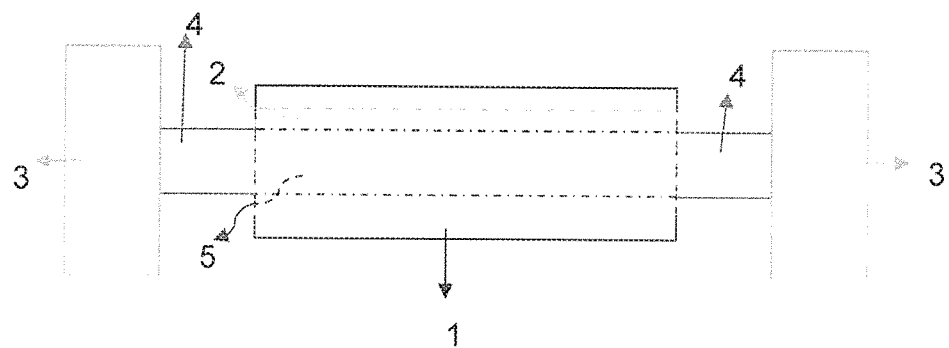
FIGS. 9A and 9B illustrate a cross-sectional view taken along a direction along source and drain regions and a top view of a gate-all-around MOSFET, respectively.
Figure 9B:
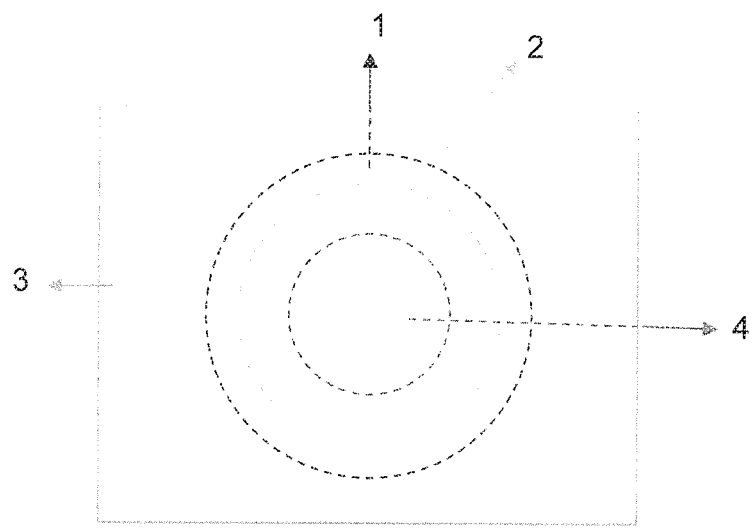

FIGS. 8A-8C illustrate a first cross-sectional view taken along a direction along source and drain regions, a second cross-sectional view taken along a direction perpendicular to the direction along the source and drain regions, and a top view of a fin MOSFET, respectively. FIGS. 9A and 9B illustrate a cross-sectional view taken along a direction along source and drain regions and a top view of a gate-all-around MOSFET, respectively.

The same reference numbers are used in FIGS. 6A-6C, FIGS. 8A-8C, and FIGS. 9A and 9B to refer to the same or like elements. Thus, an overlapped description will be omitted here to avoid redundancy.

One of ordinary skill in the art, however, should appreciate that the source and drain regions 3 and the channel region 5 in the fin MOSFET shown in FIGS. 8A-8C are formed in a fin structure protruding from the substrate 10. In addition, a buried insulating layer 6 can be formed in the substrate 10 in order to reduce leak current.

One of ordinary skill in the art should appreciate that the gate insulating layer 2 and the gate electrode 1 in the gate-all-around MOSFET shown in FIGS. 9A-9B wrap around the channel region 5, rather than covering only a top surface of the channel region 5 shown in the MOSFET shown in FIGS. 6A-6C.

A method for manufacturing the fin MOSFET and the gate-all-around MOSFET can be referred to the process flowchart shown in FIGS. 2 and 7, and a description thereof will be omitted here for avoid redundancy.

As described above, according to some embodiments of the present disclosure, a high-κ dielectric layer is directly formed on a semiconductor layer, without surface passivation or surface treatment such as forming an inserted interfacial passivation layer (IPL) having a lower dielectric constant than that of the high-κ dielectric layer therebetween. The interface between the high-κ dielectric layer and the semiconductor layer can have an extremely low interfacial trap density. In some embodiments, $D_{it}$, the interfacial trap density, can be $2-3\times10^{11}$ cm$^{-2}$eV$^{-1}$. The interface can be sustained at a temperature higher than 700° C., for example, up to 1050° C. without degrading its characteristics. In some embodiments, the interface can allow a process such as ion implantation in source/drain regions or source/drain regrowth to be performed at a temperature above 700° C., which is required in manufacturing integrated circuits. In addition, without surface treatment or surface passivation to the semiconductor layer prior to growth the high-κ dielectric layer, manufacturing time and cost can be reduced.

According to one aspect of the present disclosure, a method for manufacturing a semiconductor device includes forming a semiconductor layer on a substrate, forming one or more high-κ dielectric layers directly on the semiconductor layer as formed, and annealing the semiconductor layer, the one or more high-dielectric layers, and the substrate. The semiconductor layer is a Group III-V compound semiconductor.

According to one aspect of the present disclosure, a transistor includes source and drain regions, a semiconductor layer between the source and drain regions, a gate electrode layer covering the semiconductor layer, and one or more high-κ dielectric layers disposed between the gate electrode layer and the semiconductor layer. The one or more high-κ dielectric layers directly contact the semiconductor layer. An interfacial trap density $D_{it}$ of an interface between the semiconductor layer and the high-dielectric layer is from about $2\times10^{11}$ cm$^{-2}$eV$^{-1}$ to about $3\times10^{11}$ cm$^{-2}$eV$^{-1}$.

According to one aspect of the present disclosure, a method for forming a transistor includes forming a semiconductor layer on a substrate, forming, by atomic layer deposition (ALD), one or more high-κ dielectric layers directly on the semiconductor layer as formed, annealing the semiconductor layer, the one or more high-κ dielectric layers, and the substrate, forming source and drain regions, forming a gate electrode covering the one or more high-κ dielectric layers, and forming source and drain contacts electrically connected to the source and drain regions, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a semiconductor layer on a substrate;
    forming one or more high-κ dielectric layers directly on the semiconductor layer as formed; and
    annealing the semiconductor layer, the one or more high-κ dielectric layers, and the substrate, such that after the annealing, a first formed layer among the one or more high-κ dielectric layers is in direct contact with the semiconductor layer,
    wherein the semiconductor layer is a Group III-V compound semiconductor,
    the annealing is performed at an annealing temperature having a range from 900° C. to about 1500° C.,
    the annealing is performed in a nitrogen-containing gas including $N_2$, $NH_3$, an organic nitrogen-containing gas, or combination thereof,
    the one or more high-κ dielectric layers include $Y_2O_3$ directly contacting the semiconductor layer, and
    the semiconductor device is a capacitor, and a range of an interfacial trap densities for the capacitor measured by a room temperature conductance method, is $2\times10^{11}$ eV$^{-1}$cm$^{-2}$ to $4\times10^{11}$ eV$^{-1}$cm$^{-2}$ in an energy range $(E-E_V)$ of 1.0 to 1.1 eV, where $E_V$ is a valence band maximum.

2. The method of claim 1, wherein the annealing is performed at an annealing temperature having a range from 900° C. to about 1050° C.

3. The method of claim 1, wherein the Group III-V compound semiconductor includes at least one selected from the group consisting of AlP, AlAs, AlSb, AlBi, GaN, GaP, GaAs, GaSb, GaBi, InN, InP, InAs, InSb, InBi, $Al_xGa_{1-x}As$ (0<x<1), $In_xGa_{1-x}As$ (0<y<1), and a combination thereof.

4. The method of claim 1, wherein the one or more high-κ dielectric layers further include a high-κ oxide.

5. The method of claim 4, wherein the high-κ oxide is at least one selected from the group consisting of $HfO_2$, $ZrO_2$, $TiO_2$, $Sc_2O_3$, $Al_2O_3$, $Ga_2O_3$, $La_2O_3$, $Ce_2O_3$, $Pr_2O_3$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, and the combination thereof.

6. The method of claim 1, wherein the one or more high-κ dielectric layers include a nitride-based material.

7. The method of claim 1, wherein the forming of the one or more high-κ dielectric layers is performed by atomic layer deposition (ALD), molecular layer deposition (MLD), chemical vapor deposition (CVD), sputtering, molecular beam epitaxy (MBE), or chemical beam epitaxy (CBE).

8. The method of claim 1, wherein the annealing gas further comprises helium, argon, oxygen, or hydrogen.

9. The method of claim 1, wherein the semiconductor layer is GaAs or InGaAs.

10. The method of claim 1, wherein prior to forming the one or more high-κ dielectric layers, no surface treatment is performed to the semiconductor layer as formed.

11. The method of claim 1, further comprising:
    forming source and drain regions;
    forming a gate electrode covering the one or more high-κ dielectric layers; and
    forming source and drain contacts electrically connected to the source and drain regions, respectively,
    wherein the one or more high-κ dielectric layers are formed by atomic layer deposition (ALD).

12. The method of claim 11, wherein prior to forming the high-κ dielectric layer, no surface treatment is performed to the semiconductor layer as formed.

13. The method of claim 11, the one or more high-κ dielectric layers further include a high-κ oxide including at least one selected from the group consisting of $HfO_2$, $ZrO_2$, $TiO_2$, $Sc_2O_3$, $Al_2O_3$, $Ga_2O_3$, $La_2O_3$, $Ce_2O_3$, $Pr_2O_3$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, and the combination thereof, or a nitride-based material.

14. A method for manufacturing a semiconductor device, comprising:
    forming a semiconductor layer including GaAs on a substrate;

forming, by atomic layer deposition (ALD), one or more high-κ dielectric layers made of oxide directly on the semiconductor layer as formed; and annealing the semiconductor layer, the one or more high-κ dielectric layers, and the substrate, such that after the annealing, a first formed layer among the one or more high-κ dielectric layers is in direct contact with the semiconductor layer, wherein the annealing is performed at an annealing temperature having a range from 900° C. to about 1500° C., wherein the annealing is performed in a nitrogen-containing gas including $N_2$, $NH_3$, an organic nitrogen-containing gas, or combination thereof, the one or more high-κ dielectric layers include $Y_2O_3$ directly contacting the semiconductor layer, and the semiconductor device is a capacitor, and a range of an interfacial trap densities for the capacitor measured by a room temperature conductance method, is $2\times10^{11}$ $eV^{-1}cm^{-2}$ to $4\times10^{11}$ $eV^{-1}cm^{-2}$ in an energy range (E-$E_V$) of 1.0 to 1.1 eV, where $E_V$ is a valence band maximum.

15. The method of claim 14, wherein the annealing is performed at an annealing temperature having a range from 900° C. to about 1050° C.

16. The method of claim 14, wherein the one or more high-κ dielectric layers further include at least one selected from the group consisting of $HfO_2$, $ZrO_2$, $TiO_2$, $Sc_2O_3$, $Al_2O_3$, $Ga_2O_3$, $La_2O_3$, $Ce_2O_3$, $Pr_2O_3$, $Nd_2O_3$, $Sm_2O_3$, $Eu_2O_3$, $Gd_2O_3$, $Dy_2O_3$, $Ho_2O_3$, $Er_2O_3$, $Tm_2O_3$, $Lu_2O_3$, and a combination thereof.

17. The method of claim 14, wherein after forming the semiconductor layer and prior to forming the one or more high-κ dielectric layers, no surface treatment is performed to the semiconductor layer as formed.

18. A method for manufacturing a semiconductor device, comprising:

forming a semiconductor layer including GaAs on a substrate;

forming, by atomic layer deposition (ALD), a first layer made of $Y_2O_3$ directly on the semiconductor layer as formed;

forming, by atomic layer deposition (ALD), a second layer made of $Al_2O_3$ directly on the first layer; and annealing the semiconductor layer, the first and second layers, and the substrate at an annealing temperature having a range from 900° C. to about 1050° C. in a nitrogen-containing gas including $N_2$, $NH_3$, an organic nitrogen-containing gas, or combination thereof such that after the annealing, the first layer is in direct contact with the semiconductor layer, wherein the semiconductor device is a capacitor, and a range of an interfacial trap densities for the capacitor measured by a room temperature conductance method, is $2\times10^{11}$ $eV^{-1}cm^{-2}$ to $4\times10^{11}$ $eV^{-1}cm^{-2}$ in an energy range (E-$E_V$) of 1.0 to 1.1 eV, where $E_V$ is a valence band maximum.

19. The method of claim 18, wherein prior to forming the first layer, no surface treatment is performed to the semiconductor layer as formed.

20. The method of claim 18, wherein the annealing gas further comprises helium, argon, or hydrogen.

* * * * *